US006635583B2

(12) United States Patent
Bencher et al.

(10) Patent No.: US 6,635,583 B2
(45) Date of Patent: *Oct. 21, 2003

(54) SILICON CARBIDE DEPOSITION FOR USE AS A LOW-DIELECTRIC CONSTANT ANTI-REFLECTIVE COATING

(75) Inventors: Christopher Bencher, Sunnyvale, CA (US); Joe Feng, Santa Clara, CA (US); Mei-Yee Shek, Burlingame, CA (US); Chris Ngai, Burlingame, CA (US); Judy Huang, Los Gatos, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,945

(22) Filed: Dec. 23, 1998

(65) Prior Publication Data

US 2003/0030057 A1 Feb. 13, 2003

Related U.S. Application Data

(63) Continuation-in-part of application No. 09/165,248, filed on Oct. 1, 1998.

(51) Int. Cl.[7] .............................................. H01L 21/302
(52) U.S. Cl. ..................... 438/761; 438/636; 438/689; 438/702; 438/780; 257/635; 257/640; 257/752; 257/775
(58) Field of Search ............................. 438/636, 700, 438/624, 638, 689, 702, 780, 761; 257/635–640, 752, 775

(56) References Cited

U.S. PATENT DOCUMENTS

| 3,510,369 A | 5/1970 | Ernick et al. ............... 148/187 |
| 4,262,631 A | 4/1981 | Kibacki ..................... 118/723 |
| 4,532,150 A | 7/1985 | Endo et al. .................. 427/39 |

(List continued on next page.)

FOREIGN PATENT DOCUMENTS

| EP | 0 613 178 A2 | 2/1994 | ........... H01L/21/90 |
| EP | 0725440 A2 | 8/1996 | ......... H01L/23/532 |
| WO | WO 99/33102 | 7/1998 | ......... H01L/21/767 |

OTHER PUBLICATIONS

Omar M. "Elementary Solid State Physics: Principles and Applications", pp. 124–125, 1975.*

(List continued on next page.)

*Primary Examiner*—Matthew Smith
*Assistant Examiner*—Renzo N. Rocchegiani
(74) *Attorney, Agent, or Firm*—Moser, Patterson & Sheridan

(57) ABSTRACT

The present invention generally provides a process for depositing silicon carbide using a silane-based material with certain process parameters that is useful for forming a suitable ARC for IC applications. The same material may also be used as a barrier layer and an etch stop, even in complex damascene structures and with high diffusion conductors such as copper as a conductive material. Under certain process parameters, a fixed thickness of the silicon carbide may be used on a variety of thicknesses of underlying layers. The thickness of the silicon carbide ARC is substantially independent of the thickness of the underlying layer for a given reflectivity, in contrast to the typical need for adjustments in the ARC thickness for each underlying layer thickness to obtain a given reflectivity. A preferred process sequence for forming a silicon carbide anti-reflective coating on a substrate, comprises introducing silicon, carbon, and a noble gas into a reaction zone of a process chamber, initiating a plasma in the reaction zone, reacting the silicon and the carbon in the presence of the plasma to form silicon carbide, and depositing a silicon carbide anti-reflective coating on a substrate in the chamber. Another aspect of the invention includes a substrate having a silicon carbide anti-reflective coating, comprising a dielectric layer deposited on the substrate and a silicon carbide anti-reflective coating having a dielectric constant of less than about 7.0 and preferably about 6.0 or less.

19 Claims, 9 Drawing Sheets

U.S. PATENT DOCUMENTS

| | | | |
|---|---|---|---|
| 4,634,601 A | | 1/1987 | Hamakawa et al. ........... 427/39 |
| 4,759,947 A | | 7/1988 | Ishihara et al. ............... 427/38 |
| 4,872,947 A | | 10/1989 | Wang et al. ................. 156/643 |
| 4,895,734 A | | 1/1990 | Yoshida et al. ............... 427/38 |
| 4,951,601 A | | 8/1990 | Maydan et al. ............. 118/719 |
| 5,011,706 A | | 4/1991 | Tarhay et al. ................. 427/39 |
| 5,086,014 A | | 2/1992 | Miyata et al. .............. 437/103 |
| 5,238,866 A | | 8/1993 | Bolz et al. .................. 437/100 |
| 5,360,491 A | | 11/1994 | Carey et al. ................ 136/256 |
| 5,401,613 A | | 3/1995 | Brewer et al. .............. 430/323 |
| 5,465,680 A | | 11/1995 | Loboda ........................ 117/84 |
| 5,468,978 A | | 11/1995 | Dowben ..................... 257/258 |
| 5,480,300 A | * | 1/1996 | Okoshi et al. ............... 432/241 |
| 5,565,084 A | | 10/1996 | Lee et al. .................... 205/646 |
| 5,591,566 A | | 1/1997 | Ogawa ....................... 430/325 |
| 5,641,607 A | | 6/1997 | Ogawa et al. ........... 430/272.1 |
| 5,658,834 A | | 8/1997 | Dowben ..................... 438/478 |
| 5,691,209 A | | 11/1997 | Liberkowski .................. 437/7 |
| 5,710,067 A | | 1/1998 | Foote et al. ................. 437/238 |
| 5,711,987 A | | 1/1998 | Bearinger et al. ............. 427/7 |
| 5,730,792 A | | 3/1998 | Camilletti et al. ..... 106/287.14 |
| 5,739,579 A | * | 4/1998 | Chiang et al. .............. 257/635 |
| 5,741,626 A | | 4/1998 | Jain et al. ................... 430/314 |
| 5,776,235 A | | 7/1998 | Camilletti et al. ....... 106/287.1 |
| 5,780,163 A | | 7/1998 | Camilletti et al. .......... 428/446 |
| 5,789,316 A | | 8/1998 | Lu ............................. 438/637 |
| 5,789,776 A | | 8/1998 | Lancaster et al. ........... 257/296 |
| 5,817,572 A | | 10/1998 | Chiang et al. .............. 438/624 |
| 5,817,579 A | | 10/1998 | Ko et al. ..................... 438/740 |
| 5,818,071 A | | 10/1998 | Loboda et al. ................ 257/77 |
| 5,869,396 A | | 2/1999 | Pan et al. ................... 438/647 |
| 5,876,891 A | * | 3/1999 | Takimoto et al. ............. 430/71 |
| 5,926,740 A | | 7/1999 | Forbes et al. ............... 438/763 |
| 6,054,379 A | | 4/2000 | Yau et al. ................... 438/623 |
| 6,071,809 A | * | 6/2000 | Zhao ........................... 438/634 |
| 6,103,456 A | | 8/2000 | Tobben et al. .............. 430/317 |
| 6,140,226 A | | 10/2000 | Grill et al. .................. 438/637 |
| 6,147,009 A | | 11/2000 | Grill et al. .................. 438/780 |
| 6,159,871 A | | 12/2000 | Loboda et al. ............. 438/786 |
| 6,245,662 B1 | | 6/2001 | Naik et al. .................. 438/622 |
| 6,316,167 B1 | | 11/2001 | Angelopoulos et al. ..... 430/313 |
| 6,340,435 B1 | * | 1/2002 | Bjorkman et al. ............ 216/72 |
| 6,444,568 B1 | | 9/2002 | Sundararajan et al. ...... 438/627 |
| 6,445,073 B1 | | 9/2002 | Zhao .......................... 257/771 |
| 6,514,667 B2 | | 2/2003 | Angelopoulos et al. .. 430/271.1 |
| 6,528,426 B1 | | 3/2003 | Olsen et al. ................ 438/689 |

OTHER PUBLICATIONS

Written Opinion, from PCT/US99/22424, dated Apr. 5, 2001.

PCT International Search Report for PCT/US99/22425 Dated Feb. 2, 2000.

Ogawa et al., "Novel ARC Optimization Methodology for KrF Excimer Laser Lithography at Low K1 Factor", *Proceedings of the SPIE, Optical/Laser Microlithography V*, vol. 1674, 1992, pp. 362–375.

Dijkstra et al., "Optimization of Anti–Reflection Layers for Deep UV Lithography", *Proceedings of SPIE Optical/Laser Microlithography, Bellingham, SPIE*, vol. 1927, pp. 275–286.

PCT International Search Report dated Mar. 9, 2000, for PCT/US99/22424.

PCT Partial International Search Report dated Mar. 21, 2000, for PCT/US99/22317.

* cited by examiner

SILICON CARBIDE DEPOSITION FOR USE AS A LOW-DIELECTRIC CONSTANT ANTI-REFLECTIVE COATING

This application is a continuation-in-part of U.S. Ser. No. 09/165,248, entitled "A Silicon Carbide Deposition For Use As A Barrier Layer And An Etch Stop, filed Oct. 1, 1998, and claims priority thereto.

FIELD OF THE INVENTION

The present invention relates generally to the fabrication of integrated circuits on substrates. More particularly, the invention relates to a low temperature method for producing a low dielectric constant (low κ) silicon carbide film utilizing organosilanes under certain process regimes, which is useful as a low κ anti-reflective coating.

BACKGROUND OF THE INVENTION

Consistent and fairly predictable improvement in integrated circuit design and fabrication has been observed in the last decade. One key to successful improvements is the multilevel interconnect technology, which provides the conductive paths between the devices of an integrated circuit (IC) device. The shrinking dimensions of features, presently in the sub-quarter micron and smaller range, such as horizontal interconnects (typically referred to as lines) and vertical interconnects (typically referred to as contacts or vias; contacts extend to a device on the underlying substrate, while vias extend to an underlying metal layer, such as M1 M2, etc.) in very large scale integration (VLSI) and ultra large scale integration (ULSI) technology, has increased the importance of reducing capacitive coupling between interconnect lines in particular. In order to further improve the speed of semiconductor devices on integrated circuits, it has become necessary to use conductive materials having low resistivity and low κ (dielectric constant less than 7.0) insulators to reduce the capacitive coupling between adjacent metal lines. The need for low κ materials extends to barrier layers, etch stops, and anti-reflective coatings used in photolithography. However, typical barrier layer, etch stop, and anti-reflective coating materials have dielectric constants that are significantly greater than 7.0 that result in a combined insulator that does not significantly reduce the dielectric constant. Thus, better materials are needed for barrier layers, etch stops, and anti-reflective coatings in the low κ substrates.

With the change in circuit density, additional process changes are needed. For instance, efforts are being made to improve the photolithography processes for more precise pattern etching. Photolithography is a technique used in making integrated circuits that uses light patterns and typically organic polymers (photoresist materials) to develop fine-scaled patterns on a substrate surface. Photoresist materials typically include, for example, naphthoquinone diazides. In many instances, to properly process the substrate with photolithography and avoid unwanted patterning, the high reflectivity of the layer to be patterned must be ameliorated so light ray reflection is reduced. Reflectivity is usually expressed as a percentage of a known standard, such as bare silicon, having a value of 100%. Extraneous reflections from underlying layers can be reflected to the photoresist and expose the photoresist in undesired areas. Any unwanted exposure can distort the lines, vias, and other features intended to be formed. The reflectivity of damascene structures, discussed below, has increased the need for better photolithography processes.

With multi-layer structures and the increased use of dielectrics, increased reflectivity has contributed to imprecise etching. Dielectric layers are naturally translucent to the ultraviolet light used to expose the photoresist. Thus, multilevel use of dielectrics in the damascene structures results in increased and unwanted reflections. As a result, an anti-reflective coating (ARC) is deposited over the layer to be etched, where the ARC is a thin sacrificial layer that has a lower reflectivity than the underlying layer and is etched by the same or similar chemistries that are used to etch the underlying layer. The ARC reduces or eliminates the extraneous reflections so that improved feature dimensions and accuracy can be more closely spaced, leading to the increased current density desired for ULSI circuits.

ARC materials can be organic or inorganic, as described in U.S. Pat. No. 5,710,067, which is incorporated by reference herein. Organic ARCs include spin-on polyimides and polysulfones, among other materials, and are generally more expensive and require more complex processing than inorganic ARCs. Inorganic ARCs include silicon nitride, silicon oxynitride, α-carbon, titanium nitride, silicon carbide, and amorphous silicon. Prior to the present invention, inorganic ARCs typically were characterized by a high κ value and were not compatible with low κ structures. Use of a high κ ARC partially negates the advantage of changing to low κ materials in that it adds a high κ material to a stack of otherwise low κ layers. In some applications, the high κ ARC can be removed from the substrate, but the removal adds complexity to the processing. Organic ARCs can be used, but they are generally more expensive and require additional processing.

FIG. 1 shows a representation of a substrate with a positive photoresist deposited over a dielectric, as part of the photolithography processing. A positive photoresist develops in the areas exposed to light, whereas a negative photoresist develops in the areas not exposed to light. The integrated circuit 10 includes an underlying substrate 12 having a feature 11, such as a contact, via, line, or trench. In this patent, "substrate" is used to indicate an underlying material, and can be used to represent a series of underlying layers below the layer in question, such as a barrier layer. A barrier layer 13 may be deposited over the substrate, followed by a dielectric layer 14. The dielectric layer may be un-doped silicon dioxide also known as un-doped silicon glass (USG), fluorine-doped silicon glass (FSG), or some other low κ material. In this example, an ARC 15 is deposited over the dielectric, followed by a photoresist layer 19.

The purpose of the ARC is to reduce or eliminate any reflected light waves, typically, by adjusting three aspects of the ARC material—a refraction index (n), an absorption index (k, distinguished from the "κ" of a "low κ" dielectric), and the thickness (t) of the ARC to create a phase cancellation and absorption of reflected light. Typically, the required n, k, and t values depend on the thickness and properties of the underlying layer and need adjustment for each particular application. A computer simulation program, such as one entitled "The Positive/Negative Resist Optical Lithography Model", v. 4.05, simulates the effect on the n, k, and t values and the reflectivity of the particular layers. The results are analyzed and are typically followed by actual testing and reviewing the results through scanning electron microscopy (SEM) techniques. A proper combination at the various values of n, k, and t is chosen to reduce the reflected light for that application. Because the values of n, k, and t are dependent on each application and each substrate thickness, the proper selection may be time consuming and onerous. In addition, the selection may be only applicable to narrow thickness ranges of the underlying layers which may cause additional difficulties in the repeatability of the deposition process from substrate to substrate.

FIG. 2 is a schematic of the photolithography process in which a light source 23 emits light, such as ultraviolet light, through a patterned template (mask) 21 that defines the pattern of light that will be projected onto the photoresist layer 19, ultimately resulting in a patterned substrate. The light causes the photoresist in the exposed area 25 to typically change its solubility to organic solvents, for instance, when exposed to violet light. Thus, the exposed areas can be removed by soaking or otherwise cleaning the exposed areas while retaining the unexposed areas.

FIG. 3 is a schematic of the substrate with the feature 27 formed thereon using the etching process. The remainder of the photoresist has been removed, the feature has been etched to the appropriate level, and the substrate is prepared for a subsequent process such as the deposition of a liner, dielectric, conductor, or other layer(s).

Traditional deposition/etch processes for forming interconnects has also been improved with the higher circuit density to obtain more precise pattern etching. Thus, new processes are being developed. For instance, the traditional method of forming the circuit was depositing blanket layers of a conductor, etching the conductor to pattern the features, and then filling the features with dielectric materials. With the emphasis on increased circuit density, the process has been somewhat reversed by depositing dielectric layers, etching the dielectric layers to form the features, and filling the features with conductive material to form the vias, lines, and other features. The current trend is to use a damascene structure. In a dual damascene structure, the dielectric layer is etched to define both the contacts/vias and the interconnect lines in multi-layered substrates. Metal is then inlaid into the defined pattern and any excess metal is removed from the top of the structure in a planarization process, such as chemical mechanical polishing (CMP).

FIG. 4 shows one example of a dual damascene structure. Two predominate schemes currently are used to develop a dual damascene structure, where lines/trenches are filled concurrently with vias/contacts. In a "counterbore" scheme, the integrated circuit 10 includes an underlying substrate 12, which may include a series of layers deposited thereon and in which a feature 11 has been formed. A barrier layer 13 may be deposited over the substrate, followed by a dielectric layer 14. A liner 22 may be needed, which typically is Ta, TaN, Ti, TiN, and other materials. The dielectric layer may be un-doped silicon dioxide also known as un-doped silicon glass (USG), fluorine-doped silicon glass (FSG), or some other low κ material. A low κ etch stop 16, such as α-C, α-FC, parylene, $AF_4$, BCB, PAE, oxynitride or silicon carbide, is then deposited on the dielectric layer 14 to a thickness of about 200 Å to about 1000 Å. The etch stop material is typically a material that has a slower etching rate compared to the dielectric layer that is etched and allows some flexibility in the etching process in insuring that a predetermined depth is reached. In some well characterized etching processes, the etch stop may be unnecessary. Another dielectric layer 18 is deposited over etch stop 16 to a thickness of about 5,000 Å to about 10,000 Å. An ARC 15, similar to the ARC 15 of FIG. 1, is deposited on the dielectric layer 18, followed by a photoresist layer (not shown), similar to photoresist layer 19 shown in FIG. 1. The photoresist layer is exposed to form a pattern for the via/contact 20a, using conventional photolithography. The layers are etched using conventional etch processes, such as using fluorine, carbon, and oxygen ions to form the via/contact 20a, and the photoresist layer is removed. Another photoresist layer is deposited and exposed to pattern the line/trench 20b, the layer(s) are etched to form the line/trench 20b, and the photoresist layer is removed. A conductive material 20 is then deposited simultaneously in both the via/contact 20a and the line/trench 20b. Once the conductive material 20 has filled the feature(s), another barrier layer 24 may be deposited to help prevent diffusion of the conductor, such as the copper, for the next series of layers, if applicable.

The other predominate scheme for creating a dual damascene structure is known as a "self-aligning contact" (SAC) scheme. The SAC scheme is similar to the counterbore scheme, except that a photoresist layer is deposited over the etch stop 16 prior to the deposition of the dielectric layer 18. The etch stop 16 is etched to form a pattern for a via/contact 20a. The photoresist layer is removed and the dielectric layer 18 and ARC 15 are then deposited over the etch stop, followed by another photoresist layer deposited on the ARC 15. The photoresist is then exposed to form the pattern for the line/trench 20b, the line/trench 20b and the via/contact 20a are etched simultaneously, and the photoresist layer is removed. Conductive material 20, and if desired, another barrier layer 24, are then deposited. These structures are exemplary for a dual damascene structure and others, such as some described below, may be more appropriate for the particular application.

The reflectivity of such multilevel structures as a damascene structure has raised the needed level of performance of ARC materials. Prior to such structures, the layer to be etched was typically above a single metal layer which is not transparent to the light exposure. Thus, the unwanted photoresist exposure from underlying layers was substantially limited to the single metal layer under the photoresist. However, in damascene and other structures, an increased number of layers above the conductor layer are now used with multilevel patterning. The dielectric layer(s) and other layers beside the conductor layer are comparatively transparent to the exposure light and thus more levels of reflections can hinder the photolithography processing of the upper layer. For instance, lines and vias/contacts may appear in the substrate at different levels. Light reflected from the different features at the different levels result in different reflected light patterns back to the photoresist layer and unless corrected may cause the unwanted exposure on the photoresist described above.

Thus, with the decreasing feature sizes, the emphasis on low κ stacks, the use of copper, and the complex dual damascene structures, new methods and materials are needed to provide improved ARC characteristics. Silicon nitride and oxynitride have been typical materials used for an ARC, but have a relatively high dielectric constant (dielectric constant greater than 7.0) and may significantly increase the capacitive coupling between interconnect lines. The capacitive coupling may lead to cross talk and/or resistance-capacitance (RC) delay, i.e., the time required to dissipate stored energy, that degrades the overall performance of the device. Additionally, silicon nitride and oxynitride have relatively poor diffusion resistance compared to the material of the present invention.

In searching for new materials, others have recognized some potential in silicon carbide (SiC) for some applications. But to the knowledge of the inventors, no source has adequately sought and developed a suitable ARC, barrier layer, and etch stop, using SiC. Some sources, including U.S. Pat. No. 5,710,067 to Foote, et al., above, have noted or suggested silicon carbide in some form as an ARC. To the knowledge of the inventors, silicon carbide that has been produced using these traditional methods has not been effective in meeting the new process requirements in low κ structures. For instance, the disclosed chemistry of U.S. Pat. No. 5,591,566 to Ogawa, which patent is incorporated herein by reference, uses separate sources of silicon, carbon, and hydrogen. This more traditional approach results in a higher κ than is desirable for the low κ emphasis of the ULSI efforts, especially in damascene structures. Another example, disclosed in U.S. Pat. No. 5,360,491 to Carey, et al., which is also incorporated herein by reference, requires a conversion to a crystalline silicon carbide, denoted as β-SiC.

Another reference referring to SiC is U.S. Pat. No. 4,532,150 to Endo et al., which is incorporated herein by reference, wherein Endo refers to a specific formulation of $Si_xC_{1-x}$ in which x is a positive number of 0.2 to 0.9 for providing SiC to a substrate surface. Endo provides no disclosure of SiC as a barrier layer, etch stop, or ARC, and the process parameters given in its examples are below the preferred or most preferred parameters of the present invention. U.S. Pat. No. 5,465,680 to Loboda, incorporated herein by reference, discloses a SiC film in a CVD chamber, but fails to produce the film at low temperatures less than about 600° C. Another reference, U.S. Pat. No. 5,238,866 to Bolz, et al., also incorporated herein by reference, uses methane, silane, and phosphine to create a hydrogenated silicon carbide coating for use in the medical field, having an improved compatibility with blood. However, none of these references contain a disclosure for SiC with the following process regimes used as a barrier layer, etch stop, or a low κ ARC.

Therefore, there is a need for an improved process using silicon carbide as a low κ ARC for ICs, especially in a damascene structure and especially a SiC material that has set values for n, k, and the thickness of the SiC layer without necessitating experimentation for the proper values for each application.

SUMMARY OF THE INVENTION

The present invention generally provides a process for depositing silicon carbide using a silane-based material with certain process parameters that is useful for forming a suitable ARC for IC applications. The same material may also be used as a barrier layer and an etch stop, even in complex damascene structures and with high diffusion conductors such as copper. Under certain process parameters, a fixed thickness of the silicon carbide may be used on a variety of thicknesses of underlying layers. The thickness of the silicon carbide ARC is substantially independent of the thickness of the underlying layer for a given reflectivity, in contrast to the typical need for adjustments in the ARC thickness for each underlying layer thickness to maintain a given reflectivity.

A preferred process sequence for forming a silicon carbide anti-reflective coating on a substrate, comprises introducing silicon, carbon, and a noble gas into a reaction zone of a process chamber, initiating a plasma in the reaction zone, reacting the silicon and the carbon in the presence of the plasma to form silicon carbide, and depositing a silicon carbide anti-reflective coating on a substrate in the chamber.

Another aspect of the invention includes a substrate having a silicon carbide anti-reflective coating, comprising a semiconductor substrate, a dielectric layer deposited on the substrate, and a silicon carbide anti-reflective coating having a dielectric constant of less than about 7.0 and preferably about 6.0 or less.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 1:
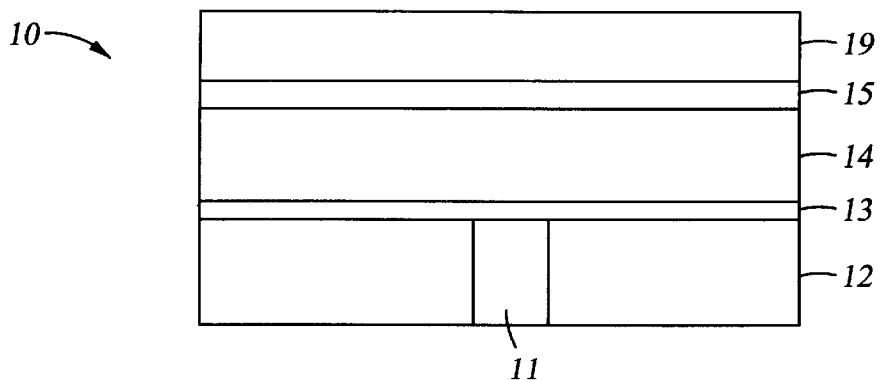
FIG. 1 is a schematic of photoresist material on an ARC in a substrate.

The present invention provides a SiC material, formed according to certain process regimes, useful as an ARC for an IC. The same material may also be used as a barrier layer and/or etch stop, and particularly for an IC using high diffusion copper as a conductive material. The invention also provides processing regimes that includes using an organosilane as a silicon and carbon source, perhaps independently of any other carbon source or hydrogen source necessary to produce the SiC and perhaps in the absence of a substantial amount of oxygen. The process regimes also include the presence of a noble gas, such as helium or argon, and certain temperatures, pressures, power outputs in a plasma enhanced chemical vapor deposition chamber to produce the SiC of the present invention. This particular SiC material may be especially useful in complex structures, such as a damascene structure.

Table 1 below shows some of the general requirements for an ARC. Because the SiC, as explained below, may be used in multiple functions, Table 1 shows the desirable aspects of at least three of the uses of the SiC of the present invention as an ARC, a barrier layer, and an etch stop.

TABLE 1

| DESIRABLE CHARACTERISTICS OF ARC/BARRIER/ETCH STOP | |
| --- | --- |
| Anti-Reflective Coating Indexes n, k | Multi-application suitability |
| | Multi-purpose use |
| | Low $\kappa$ retained for particular n, k |
| | Stable and repeatable |
| | Elimination of undesired reflections |
| | Multiple photolithography uses |
| Good Barrier Property to Copper | Good Adhesion |
| | No Copper Diffusion at 400°–450° C. Annealing Stage |
| High Etch Selectivity with respect to USG/FSG/Other Low $\kappa$ Dielectric Materials | Etch Stop >20:1 |
| Lower Dielectric Constant | Overall Reduction in Effective Dielectric Constant ($K_{eff}$) in IMD Damascene Stacks |
| Good Electrical Properties | High Breakdown Voltage Low Leakage |
| Productivity/Manufacturability | Process Stability and Particle Control |
| | In-situ Process for Throughput Improvement, e.g., USG Deposition with Etch Stop Layer Deposition |

If the SiC is used as an ARC, desirable characteristics would include the low $\kappa$ aspect described above as well as a suitable refraction index "n" combined with an absorption index "k" and a thickness "t" of the ARC to obtain a low reflectivity below about 5%, although other values may be selected, so that the coating could be used in multiple applications without necessitating adjustments and variations for each application, as is typically needed, prior to the present invention. The process to produce the SiC should be stable and repeatable for manufacturing consistency.

Because the ARC may remain on the substrate because of its low $\kappa$ attributes, it may also function as a barrier layer between, for instance, an underlying dielectric and a conductor material, such as copper. Thus, the barrier properties may be important in such instances. Adhesion between the layers is important to reduce delamination between the layers and, in some instances, to reduce capacitance and resistance between the layers. When the ARC is used as a barrier, the material should also have no substantial diffusion at a substrate annealing temperature of, for example, 400°–450° C. The term "no substantial" diffusion is intended to be a functional term, such that any actual diffusion into the layer is less than would affect the ability of the layer to function as a barrier layer and/or etch stop. For instance, the SiC of the present invention limits the diffusion to about 250 Å. The copper diffusion may impair the desired current and voltage paths and contribute to cross talk. Because of the decreasing feature size, as described above, the lower the dielectric constant, preferably less than 7.0, the lower the probability for cross talk and RC delay which degrades the overall performance of the device. A low $\kappa$ material is defined herein as a material having a dielectric constant lower than that of silicon nitride (dielectric constant of greater than or equal to 7.0), which has traditionally been used as a barrier layer material. Related to the low dielectric value is the "effective" dielectric constant, which is a composite dielectric constant of the substrate stack with multiple levels. The effective dielectric constant is based on such factors as the layer thicknesses, layer dielectric constants, spacing between features, and feature dimensions. Commercially available software, such as "Rafael" by Avant Corporation may be used to calculate the predicted effective dielectric constant. For instance, a typical value of a low $\kappa$ dielectric layer is about 2.7. A SiN layer may have a $\kappa$ value of 7.0. Using the SiN material with the low $\kappa$ material would increase the effective $\kappa$ value of the composite and offset some of the advantage of using the low $\kappa$ dielectric material. In comparison, using the SiC of the present invention with a $\kappa$ value of less than 5, preferably about 4.2, allows more benefit from using low $\kappa$ dielectric material to be obtained. A desirable effective dielectric constant value for the composite structure would be about 5.0 or less, most preferably 3.0 or less.

Because the SiC may be used in a damascene structure and function as a dual purpose ARC and etch stop as discussed below in one embodiment, it would be beneficial to also have suitable etch stop characteristics, such as an etch selectivity ratio of 20 to 1 or greater with respect to USG, FSG, or other low $\kappa$ dielectric materials. Additionally, the material should have a high breakdown voltage of 2 MV or more, i.e., the voltage gradient at which the molecules breakdown to allow harmful passage of electrical current. The SiC should also have a low leakage characteristic through the layer, i.e., a low stray direct current that capacitively flows through the material.

Another desired characteristic from a commercial standpoint is that the deposition of the material may be performed in situ, i.e., in a given chamber, such as in a plasma chamber, or in a system, such as an integrated cluster tool arrangement, without exposing the material to intermediate contamination environments. This aspect may be particularly important with a copper conductor, because of its rapid susceptibility to oxidation.

Table 2 shows the process parameters of the present invention used in a 200 mm wafer deposition reactor that allows the SiC material to be used as an ARC, as well as a barrier layer and an etch stop. In the preferred embodiments, the silicon and carbon were derived from a common compound, such as a silane-based compound. However, the carbon could be supplemented with other compounds, such as methane. Without limitation, suitable silane-based compounds could include: methylsilane ($CH_3SiH_3$), dimethysilane (($CH_3)_2SiH_2$), trimethylsilane (($CH_3)_3SiH$), diethylsilane (($C_2H_5)_2SiH_2$), propylsilane ($C_3H_8SiH_3$), vinyl methylsilane ($CH_2$=$CH)CH_3SiH_2$), 1,1,2,2-tetramethyl disilane ($HSi(CH_3)_2$—$Si(CH_3)_2H$), hexamethyl disilane (($CH_3)_3Si$—$Si(CH_3)_3$), 1,1,2,2,3,3-hexamethyl trisilane ($H(CH_3)_2Si$—$Si(CH_3)_2$—$SiH(CH_3)_2$), 1,1,2,3,3-pentamethyl trisilane ($H(CH_3)_2Si$—$SiH(CH_3)$—$SiH(CH_3)_2$), and other silane related compounds. For the purposes of this invention, the term "organosilane" as used herein includes any silane-based compound having at least one carbon atom attached, including the preceding list, unless otherwise indicated. In Table 2, the compounds used were trimethylsilane and methylsilane. A noble gas, such as helium or argon, was present and may assist in stabilizing the process, although other gases could be used.

The inventors have discovered that the process regimes described below provide a SiC material that meets at least some of the characteristics of Table 1 of an ARC, as well as a barrier layer and/or etch stop. Using the process regimes, the SiC has a low dielectric constant of less than about 7.0 and preferably about 6.0 or less. Importantly, the SiC properties described herein enable a thinner layer to be deposited. An effective substrate dielectric constant of the present invention may be about 5.0 or less. This effective dielectric constant meets the needs of a suitable copper-based IC and contrasts with silicon nitride material described above. As an upper layer for an ARC, the SiC, in one embodiment allows a diverse range of underlying dielectric thicknesses without needing to adjust the SiC ARC thickness. Also, in a damascene structure, the SiC of the present invention may be used as a combination etch stop and ARC, without needing the upper ARC layer, typical in photolithography. This particular SiC material also is suitable for use as a low κ, etch stop material. A low κ material is defined herein as a material having a dielectric constant lower than that of silicon nitride (dielectric constant of greater than or equal to 7.0). A low κ etch stop material is defined herein as an etch stop material having a dielectric constant lower than that of silicon nitride and having a relative oxide to etch selectivity of 20 to 1 or greater relative to the dielectric material. This ratio allows greater control over the etching process and is particularly useful when etching complex structures, such as a damascene structure. Furthermore, the SiC material of the present invention has a high resistance to copper diffusion with test data showing that the copper diffusion limit is about 200 to 250 Å deep in the barrier layer. In one embodiment, shown in FIGS. 15 and 16, the ARC may be the barrier layer functioning as the ARC without the etch stop.

TABLE 2

| Parameter | Range | Preferred | Most Pref. |
|---|---|---|---|
| Silicon (3MS or MS-sccm) | 10–1000 | 30–500 | 50–200 |
| Carbon (3MS or MS-sccm) | above | above | above |
| Noble (He or Ar-sccm) | 50–5000 | 100–2000 | 200–1000 |
| Press. (Torr) | 1–12 | 3–10 | 6–10 |
| RF Power (Watts) | 100–1000 | 300–700 | 400–600 |
| Power Density (Watts/in$^2$) | 0.7–14.3 | 4.3–10.0 | 5.7–8.6 |
| Freq. (MHz) | 13.56 | 13.56 | 13.56 |
| Temp. (C.) | 100–450 | 200–400 | 300–400 |
| Spacing (Mils) | 200–600 | 300–600 | 300–500 |

Example Process—ARC/Barrier Layer/Etch Stop

To create an ARC that may also function as a barrier layer and/or etch stop, a silicon source such as trimethylsilane or methylsilane is supplied to a plasma reactor, specifically a reaction zone in the chamber that is typically between the substrate surface and the gas dispersion element, such as a "showerhead", commonly known to those with ordinary skill in the art. For a typical commercial plasma enhanced chemical vapor deposition (PECVD) chamber such as manufactured by Applied Materials, Inc. of Santa Clara, Calif., a silicon source flow rate of about 30 to 500 standard cubic centimeters (sccm) is used. The sequence and operation of a commercial PECVD chamber are well known and need no explanation for the present invention process regimes. The carbon is derived from the trimethylsilane or methylsilane, independent of other carbon sources. The reaction occurs without a substantial source of oxygen introduced into the reaction zone. In conjunction with the silicon and carbon sources, a noble gas, such as helium or argon, is flown into the chamber at a rate of about 100 to 2000 sccm. The chamber pressure is maintained between about 3 to 10 Torr. A single 13.56 MHz RF power source applies about 300 to 700 watts with a power density of about 4.3 to 10 watts/in$^2$ to the anode and cathode to form the plasma in the chamber with the silane-based gas. The substrate surface temperature is maintained between about 200° to 400° C., during the deposition of the SiC. The gas dispersion from a gas dispersion element, such as a "showerhead", is dispersed at a showerhead to substrate spacing distance between about 300 to 600 mils.

For a more optimal, designated "most preferred," process regime, the trimethylsilane or methylsilane flow rate is adjusted to about 50 to 200 sccm, the helium or argon flow rate to about 200 to 1000 sccm, the chamber pressure to about 6 to 10 Torr, the RF power to about 400 to 600 watts with a power density of about 5.7 to 8.6 watts/in$^2$, the substrate surface temperature maintained between about 300° to 400° C., and a showerhead to substrate spacing of about 300 to 400 mils, as shown in Table 2.

Figure 5:
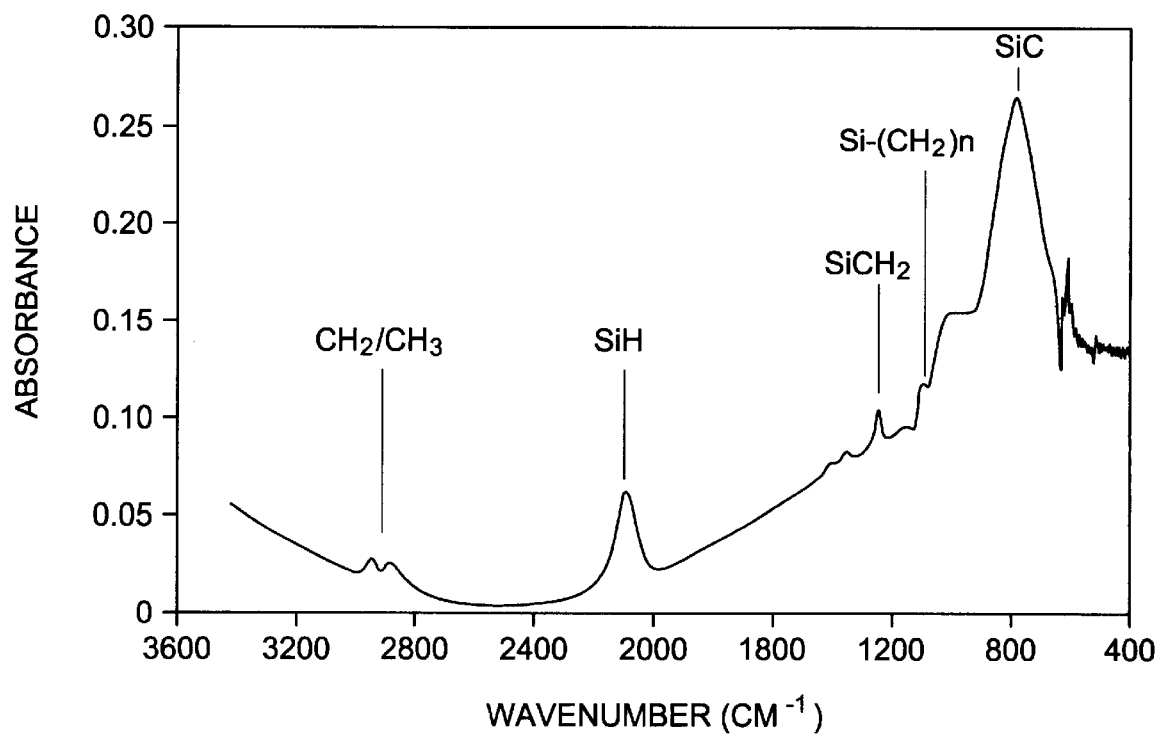
FIG. 5 is a FTIR of the SiC of the present invention, indicating a particular bonding structure.

The characteristics developed by the preferred and most preferred process regimes differ from the generally accepted silicon carbide characteristics. At these parameters, a different bonding structure occurs in the SiC of the present invention, shown in FIG. 5, compared to a prior SiC, shown in FIG. 6, described below. The charts are Fourier Transform Infrared (FTIR) charts, one of the standard laboratory tests for indicating the bonding structure, as would be known to those with ordinary skill in the art and needs no detailed explanation. The various peaks at various wave numbers are structure specific and this graph is indicative of the particular interstitial bonding structure.

Figure 6:
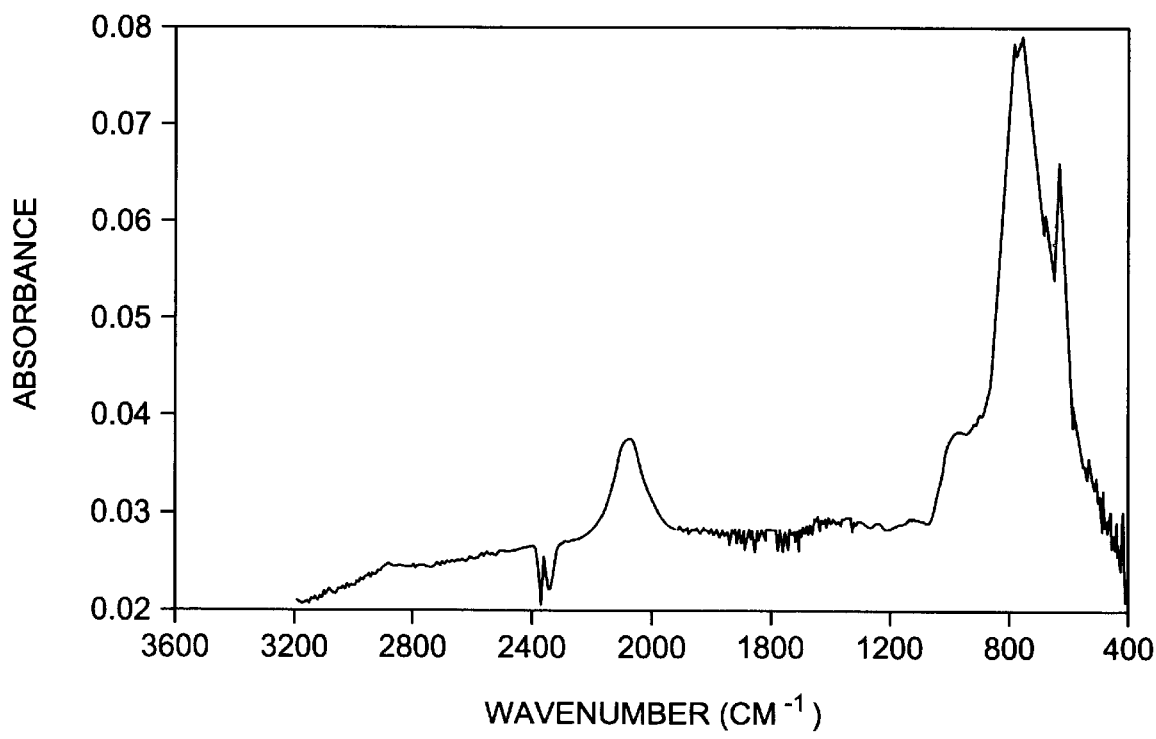
FIG. 6 is a FTIR of a previous SiC, indicating a bonding structure different than the SiC of the present invention.

FIG. 5 shows a FTIR for the SiC of the present invention. Using the most preferred range of process parameters of Table 2 with trimethylsilane, the deposition resulted in a bonding structure containing $CH_2/CH_3$, SiH, $SiCH_3$, Si—$(CH_2)n$, and SiC. FIG. 6 shows comparative results with a prior SiC material deposited using silane and methane. As can be seen, there is no corresponding peak for Si—$(CH_2)n$ and even the peak for $SiCH_3$ is not as noticeable. The SiC of the present invention has yielded these unexpected results in providing better ARC/barrier layer/etch stop performance than previous known depositions of SiC. These characteristics allow the SiC to be used in the multiple capacities disclosed herein.

Figure 7:
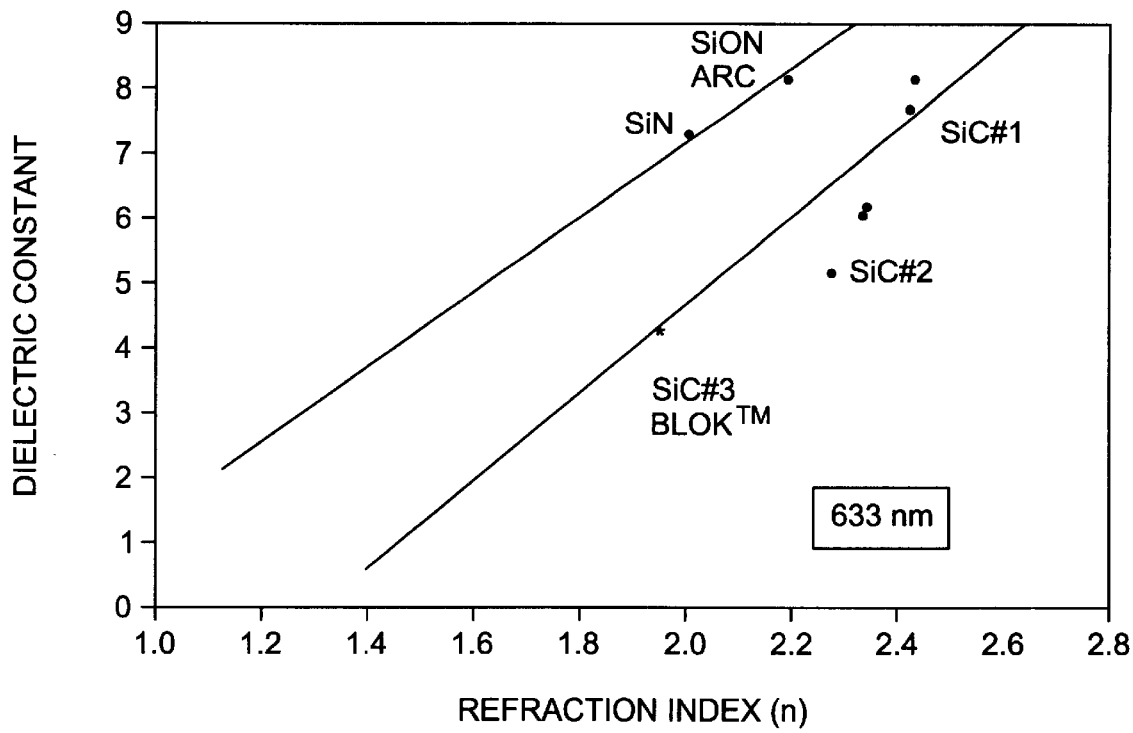
FIG. 7 is a graph of a dielectric constant compared to a refraction index for various materials.

FIGS. 7–20 show various characteristics of the SiC ARC of the present invention. FIG. 7 is a graph of test results, using a standard 633 nm wavelength of exposure light, comparing different materials and their dielectric constants versus the refraction index. The x-axis represents the refraction index, n, discussed above. A lower value on the x-axis is preferred and results in better optical quality and transparency. The y-axis represents the dielectric constant. A lower value on the y-axis is preferred to obtain a "low κ" substrate stack. For instance, SiN typically has an n value of about 2.0 and a dielectric constant value of 7.3, unsuitable for the low κ applications. A current state-of-the-art ARC is DARC™, a type of silicon oxynitride, but the dielectric constant is about 8.5–9.0 with a n of about 2.2 at a 248 nm wavelength exposure. The preferred SiC of the present invention has a dielectric constant of about 4.2.

The SiC#1 corresponds to test results using the traditional chemistry for producing SiC such as is described in U.S. Pat. No. 5,591,566 to Ogawa, discussed above, particularly using a silane with a separate methane/ethane/propane and diatomic hydrogen. This SiC has an n value of about 2.4, and a dielectric constant of about 7.8, undesirable for deposition in low κ devices. In-house test results that varied the process parameters of this traditional SiC chemistry still did not produce the results that were obtained by changing to the chemistry of the present invention, described herein.

SiC#2 is one SiC deposited using the chemistry of the present invention. The n value is about 2.3 and the dielectric constant is about 5.1, which are much better than the SiC#1 produced by traditional processing, above. Using the most preferred parameters described above in Table 2, the SiC#3 produced better optical characteristics, namely, an n value of about 1.9 at the 633 nm exposure wavelength of FIG. 6 with a dielectric constant of about 4.2. Thus, optically and resistively, the SiC of the present invention is suitable for the current emphasis on low κ structures that can be used as an ARC as well as a barrier layer and an etch stop. Importantly, the SiC of the present invention, in contrast to the traditional high κ SiC, need not be removed from the layer after the photoresist has been exposed and the substrate etched in order to preserve the low κ characteristics of the stack of layers, resulting in less processing steps.

Figure 8:
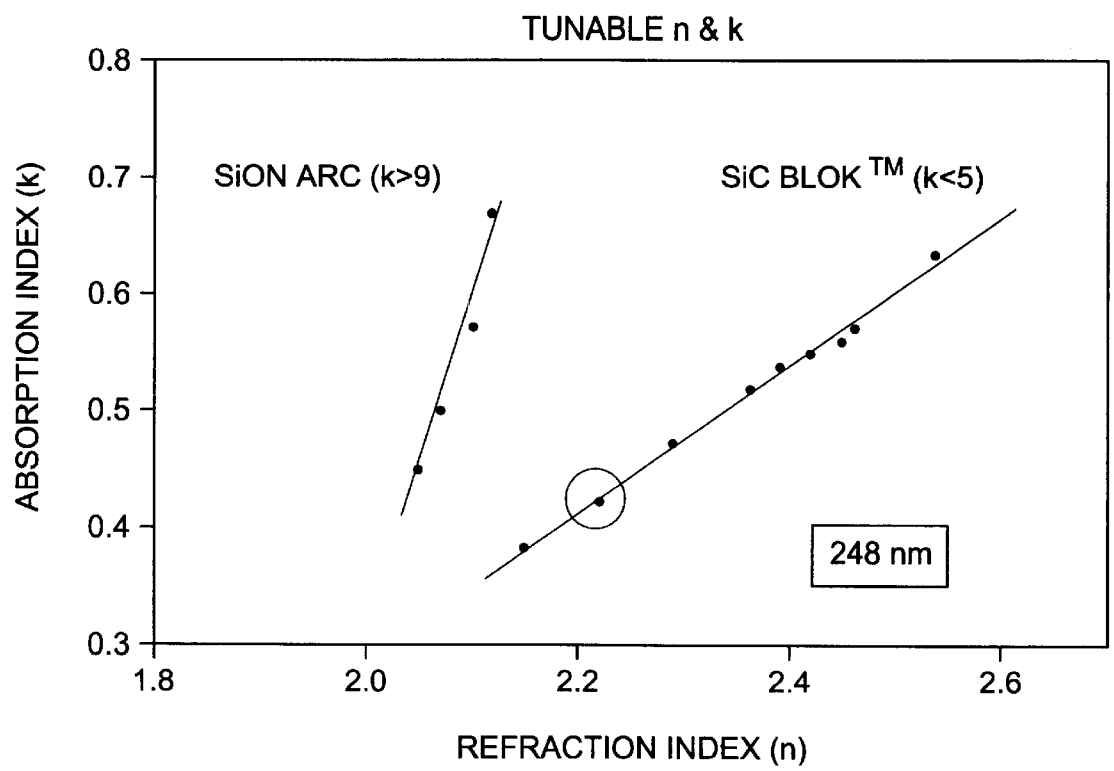
FIG. 8 is a graph of the refraction index compared to the absorption index for two materials, showing that the SiC of the present invention can be tuned to different index values.

FIG. 8 is a graph of the refraction index n compared to the absorption index k for two materials, using a 248 nm exposure wavelength typically used in photolithography processing, showing that the SiC of the present invention can be tuned to different n and k values and is compared with a silicon oxynitride ARC. The silicon oxynitride ARC has a steep slope of about 70°, a high dielectric constant of about 9, and is difficult to control the respective n and k values because of the rapid increase in k with a small change in n. By comparison, the SiC of the present invention with a dielectric constant of about 4.5, has a flatter curve, approximating a 35° upward slope of the line on the graph, so that an increase in n results in a comparative increase in k on the graph, and shows a more controllable process. A higher absorption index is desirable to better absorb the extraneous reflections, but in obtaining the higher absorption indexes, the dielectric constant increases as the line slopes upward. Thus, there is a balance between the desired optical properties and dielectric constant for the particular embodiment desired. Through experiments, the inventors believe that a suitable value for the SiC of the present invention and one that is most preferred, having a relatively low dielectric constant and a stable process regime, is about 2.2 for an n value at the 248 nm exposure wavelength of FIG. 8 and about 0.4 for a k value. In the graph, the relationship between the n and k indexes at the 248 nm exposure wavelength appears linear and is approximated by the formula below using the process parameters herein disclosed:

$$k/0.65+1.57=n$$

The absorption index k may vary with a range of between about 0.2 to about 1.0, and generally may be between about 0.3 and 1.0 for commercial uses in photolithography. The above formula is representative of the n and k characteristics of the SiC of the present invention and can be readily converted for different exposure wavelengths. Beginning at the x-axis value in FIG. 8, the slope of the SiC n and k relationship may vary from about 20° to about 60° with the slope shown as about 35°.

Importantly, the dielectric constant of the silicon oxynitride ARC is about double that of the SiC and yet the SiC has about the same n and k values. Stated differently, using the SiC of the present invention can approximate the optical qualities of the silicon oxynitride ARC and yet reduce the dielectric constant by about 50%. In a low κ stack of layers, that difference is important.

Figure 2:
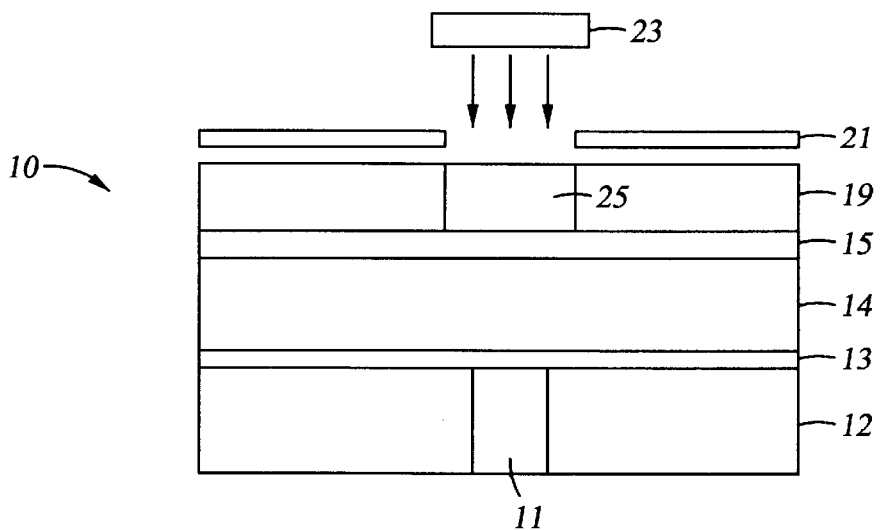
FIG. 2 is a schematic of a light exposing the photoresist of FIG. 1.
Figure 3:
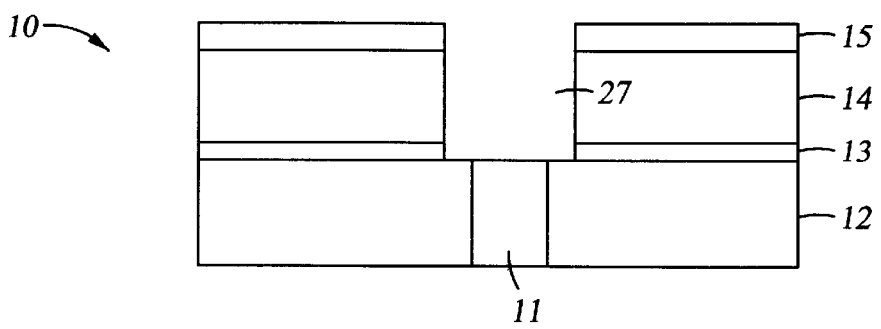
FIG. 3 is a schematic of the substrate of FIGS. 1 and 2, etched and prepared for subsequent deposition in the feature.
Figure 4:
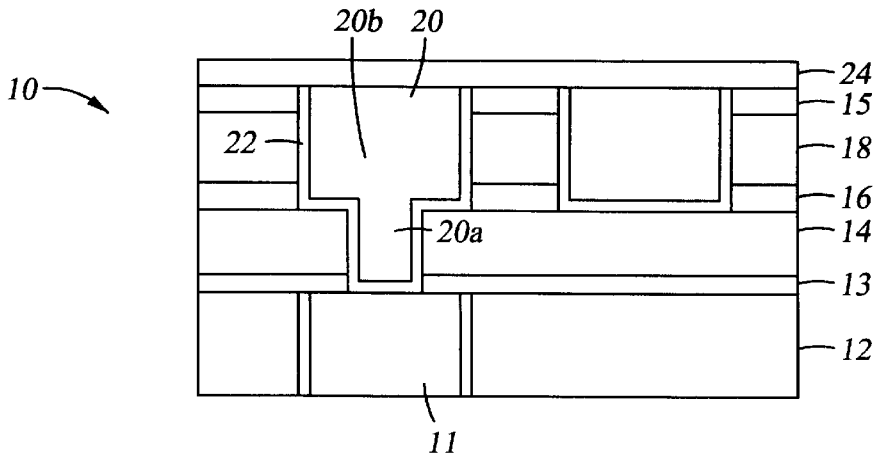
FIG. 4 is a schematic of an exemplary damascene structure.
Figure 9:
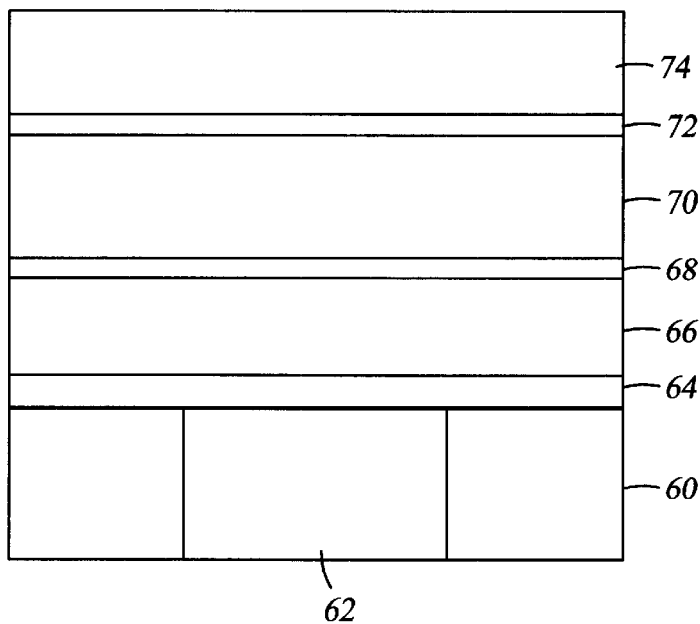
FIG. 9 is a schematic of a stack of layers using the SiC of the present invention as a barrier layer, an etch stop, and an ARC.

FIG. 9 is a schematic of a stack of layers using the SiC of the present invention as a barrier layer, an etch stop, and an ARC. The dielectric layer 60 has a contact 62, which may be a copper material. A barrier layer 64 of SiC having a thickness of about 500 Å is deposited over the dielectric layer 60 and over the contact 62. A dielectric layer 66, such as an USG layer with a thickness of about 5000 Å thick, is deposited over the barrier layer. An etch stop 68, again of about 500 Å SiC material, is deposited over the dielectric USG layer, followed by another dielectric layer 70, which also may be an USG material having a thickness of about 7000 Å. In this embodiment, an ARC 72 of SiC having a thickness of about 600 Å is deposited over the previous USG layer, and is followed by a photoresist layer 74. As described in FIGS. 1–3, the photoresist is exposed through a mask, the unwanted portions washed away, the layers etched which produces features, and further layers deposited such as liner, barrier, and conductive layers. The thicknesses, number of layers, and arrangement could vary and the embodiment is exemplary.

Figure 10:
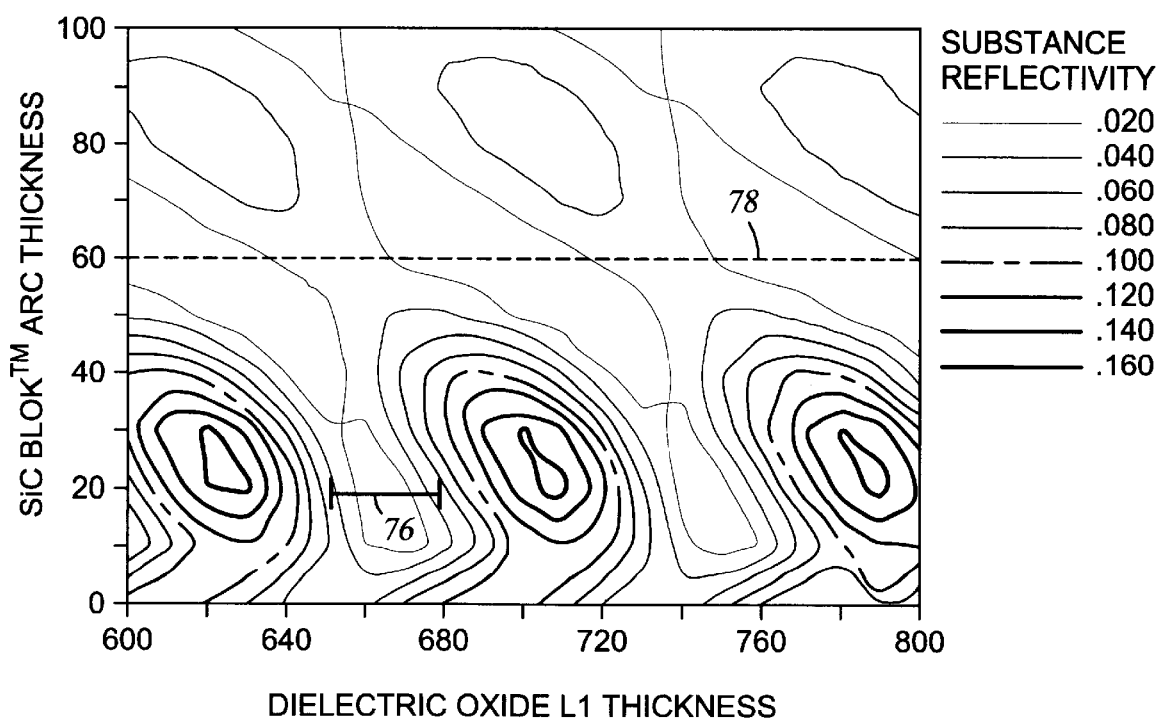
FIG. 10 is a simulation graph of reflectivity contours of the embodiment of FIG. 9.

FIG. 10 is a simulation graph of reflectivity contours for projecting reflectivity values of different combinations of layer thicknesses, using a computer simulation program, entitled "The Positive/Negative Resist Optical Lithography Model", v. 4.05. The simulation graph is used to predict the substrate reflectivity at incremental rates, resulting is a reflectivity topography that maps the effects on reflectivity of the thickness of one layer to the thickness of an adjacent layer. In FIG. 10, each contour is set to increment by 2% with the lowest being 2% reflectivity and the highest being 16% reflectivity. In this figure, the x-axis is the thickness of the underlying layer, i.e., the dielectric layer 70 in FIG. 9. The y-axis is the SiC thickness used as an ARC, corresponding to the ARC 72 of FIG. 9. The goal of obtaining low reflectivity is to minimize the extraneous reflections from the substrate at the photoresist interface between, in this instance, the photoresist layer and the ARC. An optimal reflectivity value is 0%, but Applied engineers have learned that a reflectivity of less than about 7% provides commercially acceptable results with a goal of about 5% or less being preferred to insure repeatability of the photolithography processing. While in some embodiments a 10% reflectivity is acceptable, 10% reflectivity is typically a practical limit to the current size and density of features in the substrate. Thus, if the underlying layer thickness is known and is selected on the x-axis, the corresponding preferred ARC thickness on the y-axis can be predicted by locating an ARC thickness having less than the chosen reflectivity, such as 5%. For instance, a dielectric thickness of about 6500 Å to about 6750 Å shown as range 76 in FIG. 10, will predictably need about 200 Å of ARC to meet the 5% or less reflectivity criteria. However, such a narrow range of dielectric deposition may be difficult to consistently produce and may not meet device requirements for electrical isolation of the circuit between the layers. Furthermore, the 200 Å layer may be insufficient as a barrier layer to copper if, for instance, copper was deposited on the ARC after etching.

Thus, while optically, the ARC layer would be sufficient, other properties, such as described above, may need consideration. In this figure, an ARC thickness of more than about 500 Å results in less than 5% reflectivity across the range of dielectric layer thickness in the graph. Conversely, if the dielectric layer thickness can be carefully controlled, then the ARC layer thickness can be varied or minimized. For instance, a dielectric thickness of about 6600 Å, plus or minus about 100 Å or about 1.5%, can have an ARC thickness of 50 Å or more and meet the optical parameters of 5% or less reflectivity. Thus, the SiC of the present invention satisfies the desire for a multiple purpose material in providing a barrier layer, etch stop, and an ARC and satisfies the desire for a multiple application material in that a single ARC thickness can meet the optical needs of multiple dielectric thicknesses for a given reflectivity.

In a preferred embodiment, a layer with a preferred thickness of about 600 Å offers one of the lowest reflectivity values across the entire spectrum of the dielectric layer thicknesses, shown as value 78 in the graph. Importantly, the inventors have discovered that, with the unique properties of the SiC of the present invention, an ARC can be deposited that is substantially independent of the underlying layer thickness. The range may be about 500 Å to about 1000 Å or more, with a preferred thickness of about 600 Å, having a predicted reflectivity of about 2% or less, below the preferred 5% range. This discovery contrasts with the typical need to adjust the n, k, and t characteristics of the ARC layer to the particular thickness of the underlying layer for each application. Here, using the SiC of the present invention, the ARC layer may simply be a consistent deposition thickness of about 600 Å, regardless of the underlying layer thickness. The graph may be analyzed for other appropriate ranges, as the particular application may find useful.

The SiC ARC 72 of the present invention may also be used as a polish stop. After the stack is etched and the features filled with conductive material, some processing methods polish the upper surface of the substrate surface to remove excess conductive material and planarize the upper surface to prepare for the next deposition, if applicable. Typically, the substrate is polished by a chemical mechanical polishing (CMP) process, well known to those in the field. The CMP process uses a difference in polishing rates between different materials to determine the limit of polishing, for instance, as the CMP process encounters a underlying polish resistant layer. With the present invention, the SiC ARC 72 may be used as a polish stop. Because of the low κ of the SiC ARC, the ARC will typically remain on the substrate and need not be removed to maintain an effective low κ substrate. Thus, conductive material may be deposited over the ARC, filling the features. The CMP process then is used to remove any extra conductive material or any other material above the SiC. As the CMP process determines a difference in the polishing rates when the process encounters the SiC ARC, then the CMP process may be discontinued.

Also, the SiC ARC material may be used as a moisture barrier. The CMP process is typically a wet process. Because moisture can corrupt a substrate circuit, some layer needs to be moisture resistant. If, for instance, the SiC ARC is used as a polish stop, then as an upper layer, the SiC ARC would desirably act as a moisture barrier.

Figure 11:
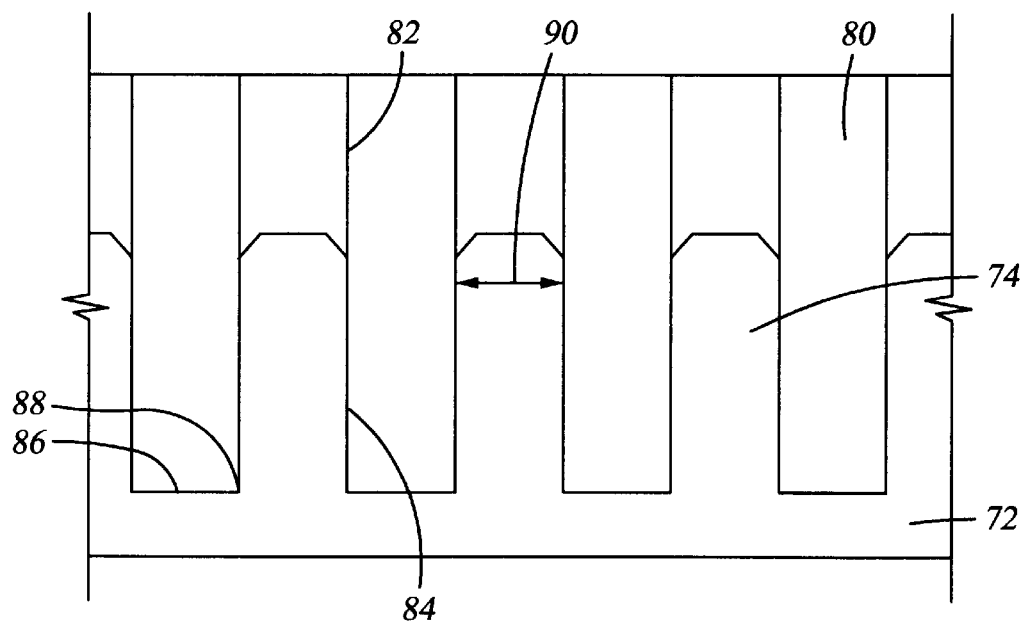
FIG. 11 is a line drawing of a scanning electron microscopy photograph, showing a patterned photoresist layer using the ARC of the present invention as an upper layer.

FIG. 11 is a line drawing of a scanning electron microscopy photograph, showing a cross section of a patterned photoresist layer 74 deposited over a SiC ARC 72 of the present invention. FIG. 11 shows the photolithography results of such embodiments as shown in FIG. 9, where the ARC is considered the top layer of the substrate prior to the photoresist layer deposition and photolithography processing. The width of the line 80 in the photoresist layer 74 is about a quarter micron, representative of the current size of features. With the SiC ARC 72 of the present invention, the photolithography patterning of the photoresist layer 74 resulted in even and straight lines 82, important for the ULSI reduced feature sizes. The patterning in the features was uniform and had straight, square sidewalls 84, i.e., no standing wave effects from extraneous light reflections, with a fully exposed bottom 86 and square corner 88 without a substantial rounded "footing" in the corner. The variation in minimum to maximum values of the photoresist width 90 between the lines is 5% or less, a standard acceptance range for processing. The repeatability from line to line is also shown. Thus, the uniformity of the patterned photoresist layer demonstrates that the SiC ARC of the present invention is able to produce a photolithography processed substrate with small features and still retain a low κ value, in contrast to other ARC materials, such as the silicon oxynitride ARC, described above.

Figure 12:
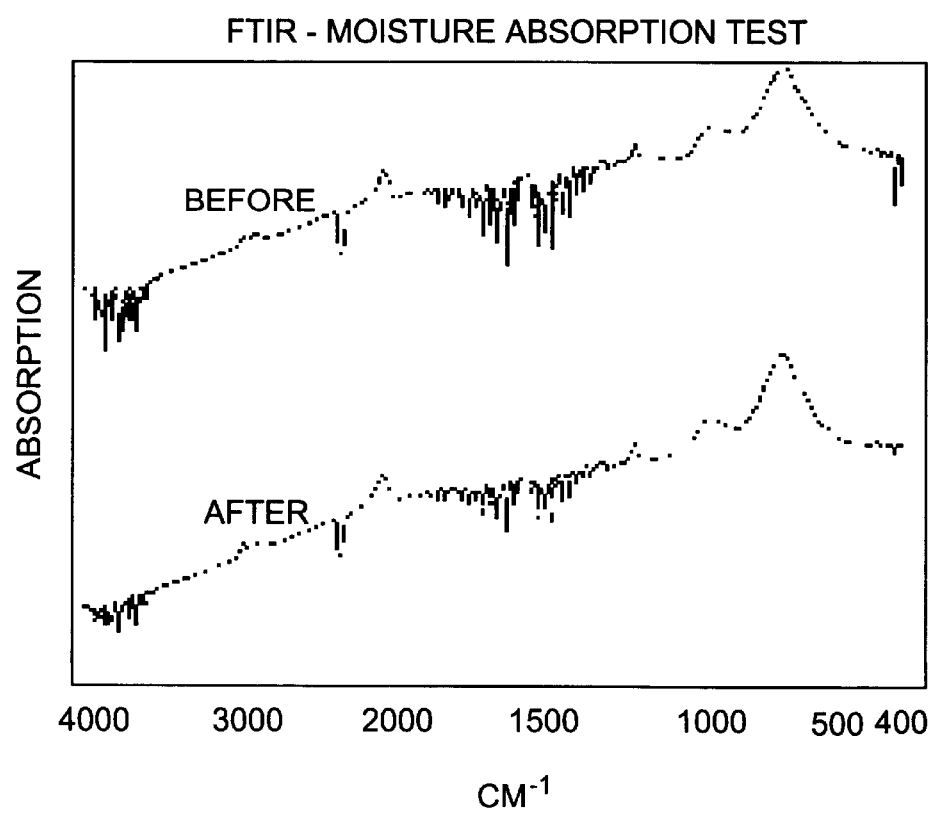
FIG. 12 are FTIR results of a moisture test of the SiC of the present invention, when the SiC ARC is also used as a moisture barrier.

FIG. 12 shows the FTIR results of a moisture test of the SiC material exposed to boiling water for a 30 minute period. The upper line of the moisture results before the exposure is offset from the lower line of the moisture results after the exposure to view both lines on the same graph. Tests results show that the SiC of the present invention acts as a moisture barrier throughout the CMP process and thus satisfies the moisture barrier aspect, as well. The moisture level is particularly noted at wave number 1640, which is the H—OH peak, where the results are substantially the same, indicating substantially no moisture absorbed.

Figure 13:
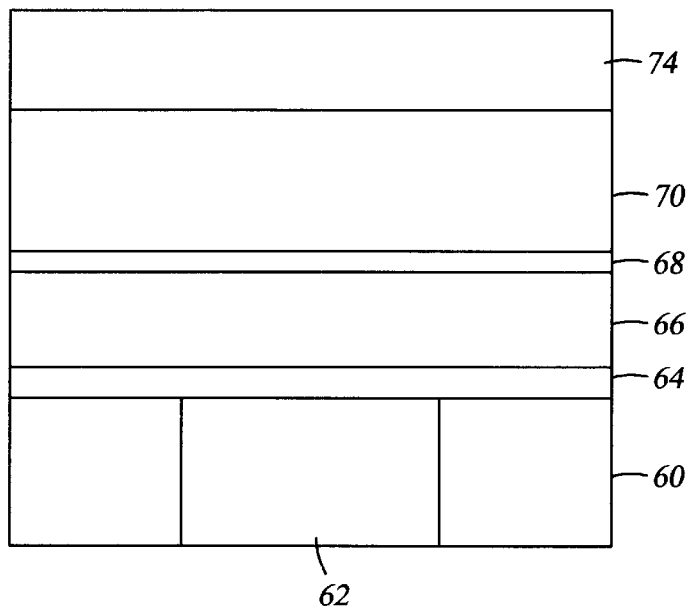
FIG. 13 is an alternative embodiment of FIG. 9, using the etch stop as the ARC without using an ARC upper layer.

FIG. 13 is an alternative embodiment of FIG. 9, without using a separate ARC, but relying on the properties of the SiC of the present invention between adjacent layers to function as an ARC, i.e., here the etch stop 68 between the dielectric layers 66 and 70. The layers and numbers correspond to the arrangement described in FIG. 9, with the difference being no ARC 72 under the photoresist layer 74. In this embodiment, the thickness of the dielectric layer 70 above the SiC etch stop 68 is adjusted in conjunction with the thickness of the SiC etch stop 68 between the dielectric layers 66 and 70 for a projected reflectivity. The thickness of the dielectric layer 66 is held constant. The photoresist layer 74 would be exposed as described above. The barrier layer 64 may be about 500 Å. However, the substrate would rely on the reflective and absorptive characteristics of the SiC etch stop 68 below the upper dielectric layer 70. Thus, the thicknesses of the two layers are interdependent for a given projected reflectivity. A proper selection of the SiC etch stop thickness makes this arrangement suitable, as shown in FIG. 14.

Figure 14:
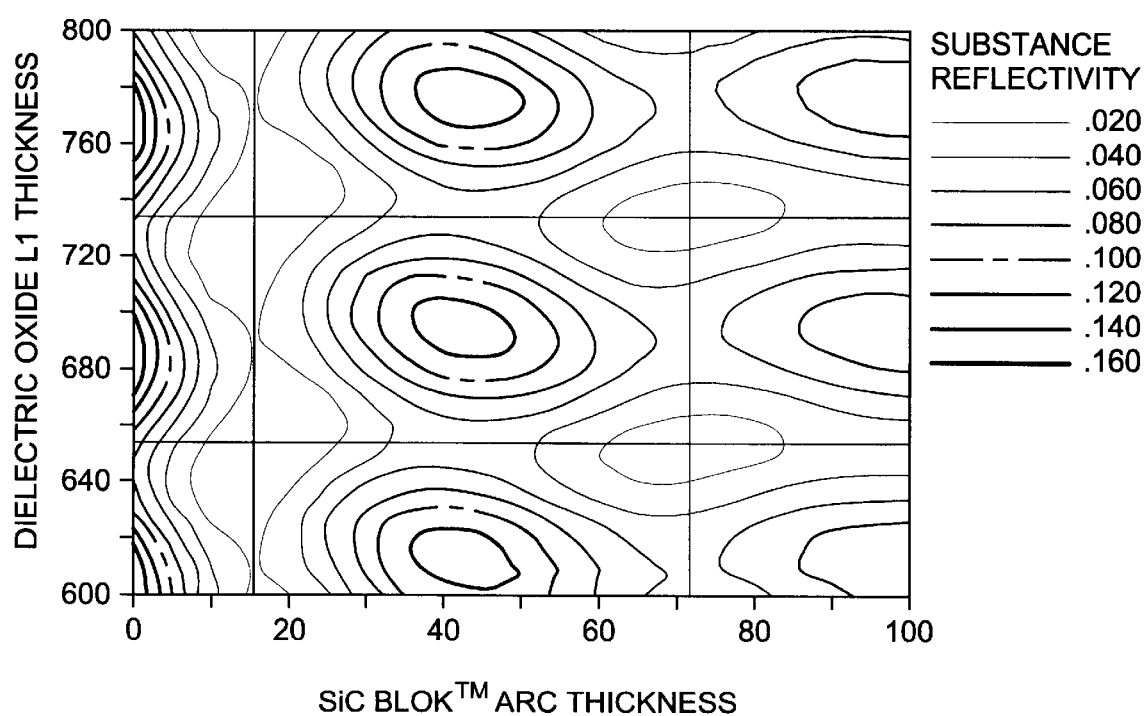
FIG. 14 is a reflectivity map of the embodiment of FIG. 13, showing the thicknesses of the upper dielectric layer compared to the etch stop.

FIG. 14 is a reflectivity map of the embodiment of FIG. 13, showing the thicknesses of the upper dielectric layer 70 compared to the etch stop 68. The y-axis is the thickness of the dielectric layer 70 and the x-axis is the thickness of the SiC etch stop 68. The axes are reversed from the reflectivity map of FIG. 10, because in this embodiment the top layer is the dielectric layer 70. Similar to the discussion in FIG. 10, the appropriate thicknesses may be selected for given reflectivity ratios, such as below about 5%. For example, an etch stop thickness of about 150 Å, plus or minus 50 Å, would optically satisfy the requirements for all the graphed thicknesses in FIG. 14 of the dielectric layer 70 and would have a reflectivity of less than about 5%. However, a 150 Å SiC layer would be undesirably thin to also function as a copper barrier layer. Factors, such as control factors in etch processing, or barrier properties may ultimately determine the proper thickness for an etch stop and whether alternative thicknesses for the optical properties of an anti-reflective coating are needed.

Also, a SiC etch stop of about 720 Å thick could be used with a top dielectric layer thickness of about 6500 Å or about 7300 Å. Because the reflectivity pattern repeats in this zone, other layer thicknesses not charted could be used and the thicknesses shown in FIG. 14 and other similar figures are typical of the thicknesses used in commercial embodiments. If a higher level of reflectivity were allowed, for instance 6%, then an etch stop thickness of about 720 Å would also satisfy the optical requirements for reflectivity for all the graphed thicknesses on FIG. 14. Conversely, if the dielectric thickness was first selected and a resulting etch stop thickness determined, then, for example, a dielectric thickness of about 6600 Å and about 7400 Å with close tolerances could allow an etch stop thickness of about 100 Å to about 350 Å with a reflectivity of about 5% or less. Other values may be determined, using the contours of the figures. Importantly, these examples show that the thickness of the etch stop and the thickness of the dielectric layer adjacent the etch stop are to be considered with respect to each other when the SiC, functioning as an ARC, is between the dielectrics for a projected or chosen reflectivity.

Figure 15:
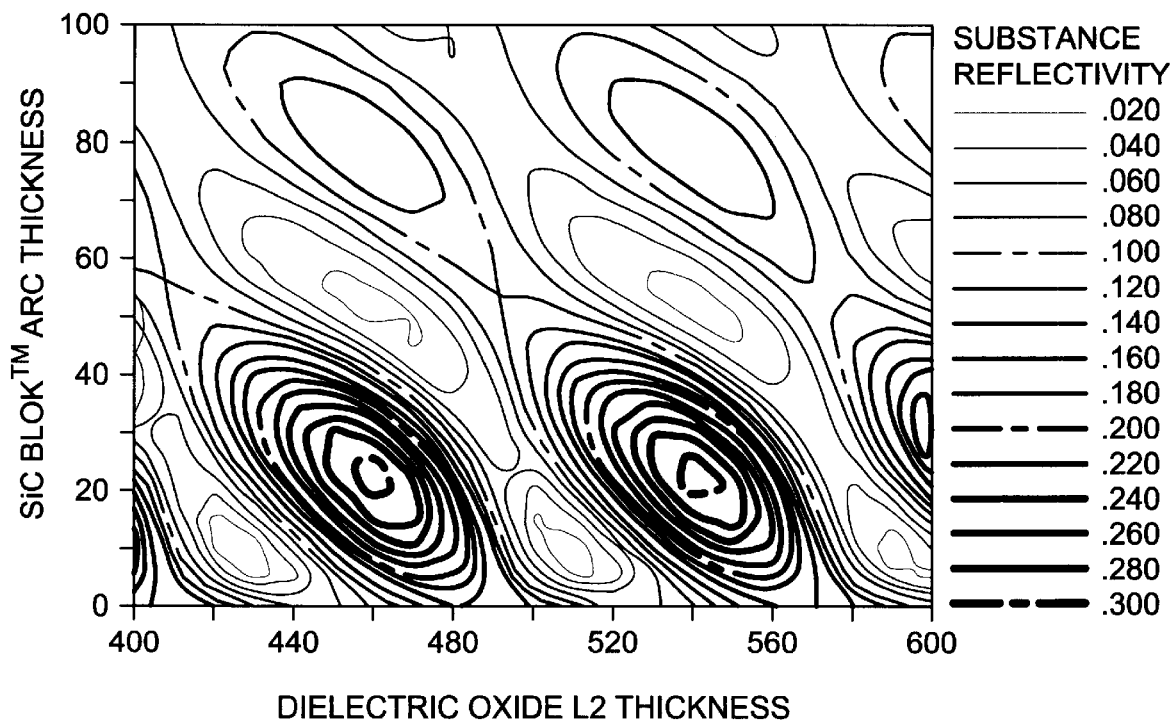
FIG. 15 is a reflectivity map of the embodiment of FIG. 13, showing the thicknesses of the etch stop compared to the lower dielectric layer under the etch stop.

FIG. 15 is another reflectivity map of the embodiment of FIG. 13, showing the thickness of the etch stop compared to the thickness of the lower dielectric layer under the etch stop, where the dielectric layer 66 below the etch stop 68 is adjusted in conjunction with the thickness of the etch stop 68 for a projected reflectivity. Here, the dielectric layer 70 may remain a certain thickness, such as 7000 Å, while the thicknesses of the etch stop 68 and dielectric layer 66 are determined for a particular reflectivity. In FIG. 15, because the etch stop 68 is the upper layer relative to the dielectric layer 66, the etch stop thickness is represented on the y-axis and the dielectric layer 66 thickness is represented on the x-axis. For instance, with a 500 Å SiC etch stop, the thickness of the dielectric layer 66 could be about 4600 Å or about 5400 Å to maintain a 5% or less reflectivity. However, the thickness of the dielectric layer 66 may change for a different thickness of the dielectric layer 70. Thus, iterative solutions may be required to find a thickness for each dielectric layer that meets the various process requirements and still collectively satisfy a reflectivity goal, here of about 5% or less.

Figure 16:
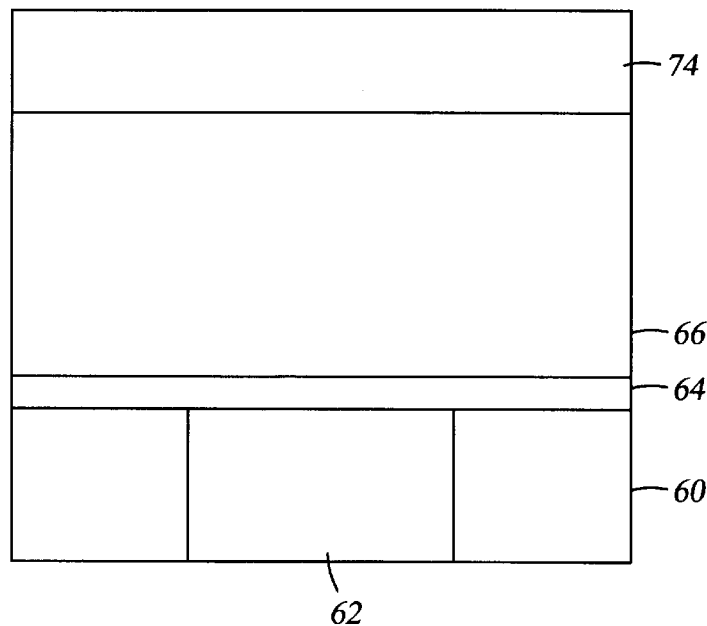
FIG. 16 is an alternative embodiment of FIGS. 9 and 13, without the etch stop and using the barrier layer as the ARC.

FIG. 16 is an alternative embodiment of FIGS. 9 and 13 without the etch stop, where the barrier layer 64 is used as the ARC. In some processes, the upper layer ARC 72 of the embodiment of FIG. 9 may not be used, as shown in FIG. 13. In still other processes, the etch stop 68 of FIG. 13 may also not be used, as shown in FIG. 16. If the etch stop can be eliminated, then the substrate processing throughput may be increased with fewer steps and a lower effective dielectric constant of the substrate may be obtained. The difficulty with eliminating the etch stop is the repeatability of the etching process and the timing of the etching so that undesired etching through typically the dielectric layer(s) does not occur. However, if the process is well characterized and has sufficient control, then the etch stop may not be used. The layers and numbers correspond to the arrangement described in FIGS. 9 and 13, with the difference being no ARC 72 under the photoresist 74 and no etch stop 68. In this embodiment, the thickness of the dielectric layer 66 is increased to compensate for the lack of the second dielectric layer 70 so that the circuit is electrically isolated and may be about 10,000 Å to about 12,000 Å thick. The dielectric layer 66 thickness is adjusted in conjunction with the thickness of the SiC barrier layer 64 between the dielectric layer 66 and the dielectric layer 60 for a projected reflectivity. The photoresist 74 would be exposed as described above. However, the substrate would rely on the reflective and absorptive characteristics of the SiC barrier layer 64 below the dielectric layer 66, where the thicknesses of the two layers are interdependent or independent, contingent upon the thickness(es) selected and the desired reflectivity. A proper selection of the SiC barrier layer thickness makes this arrangement suitable, as shown in FIG. 17.

Figure 17:
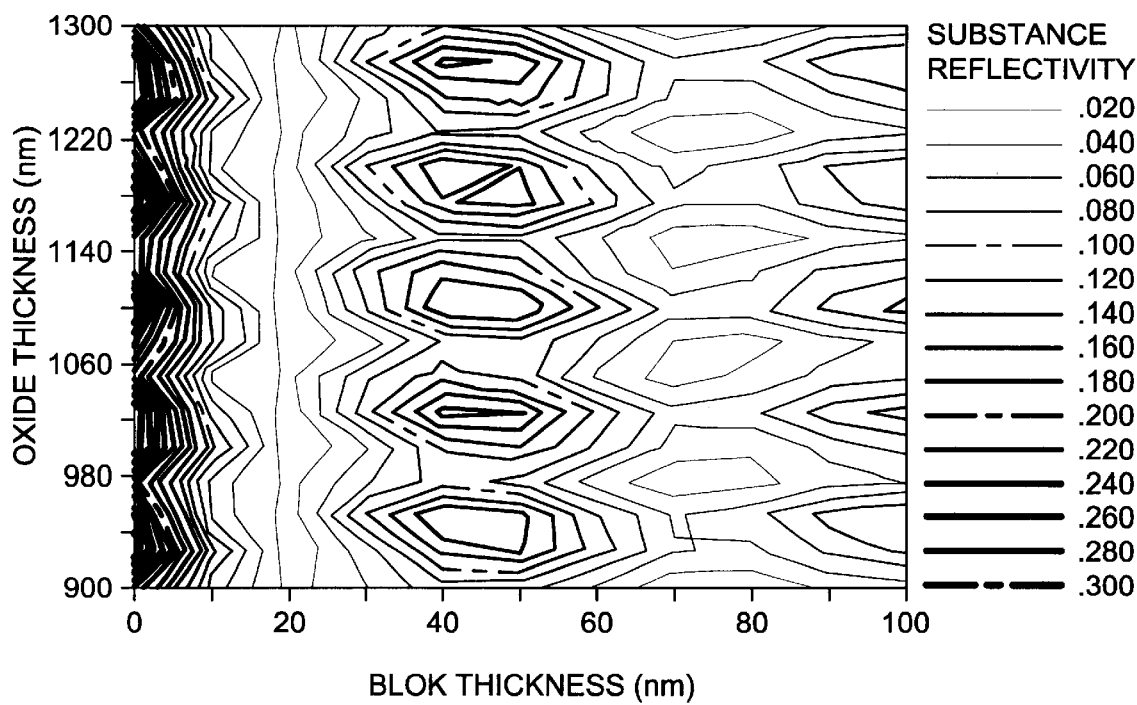
FIG. 17 is a reflectivity map of the embodiment of FIG. 16, showing the thicknesses of the dielectric layer above the barrier layer compared to the barrier layer, using the barrier layer as an ARC.

FIG. 17 is a reflectivity map of the embodiment of FIG. 16, showing the thicknesses of the dielectric layer 66 compared to the SiC barrier layer 64, using the barrier layer as an ARC. In FIG. 17, because the dielectric layer 66 is above the barrier layer, the y-axis represents the dielectric layer thickness and the x-axis represents the barrier layer thickness. Because other parameters may be considered, such as the ability of the dielectric layer to electrically isolate the circuit, the dielectric layer thickness may be first selected and the barrier layer thickness determined from the graph for a given reflectivity. A preferred thickness of the SiC barrier layer when used as an ARC, in this embodiment without the intervening etch stop, is about 700 to about 800 Å. The preferred thickness yields a predicted 5% reflectivity or less for all graphed thickness of the dielectric layer. Thus, in this embodiment as well, the SiC of the present invention provides ARC optical results substantially independent of the dielectric layer thickness.

Figure 18:
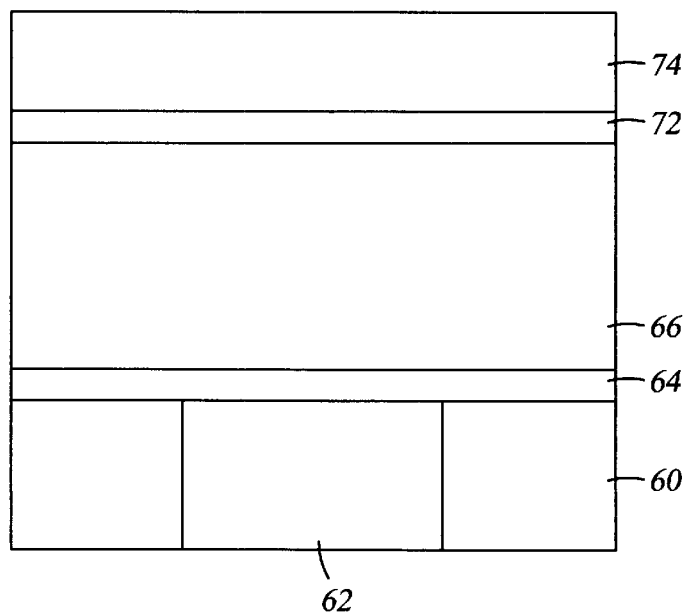
FIG. 18 is another embodiment similar to the embodiment of FIG. 16 with the addition of a SiC ARC below the photoresist layer.
Figure 19:
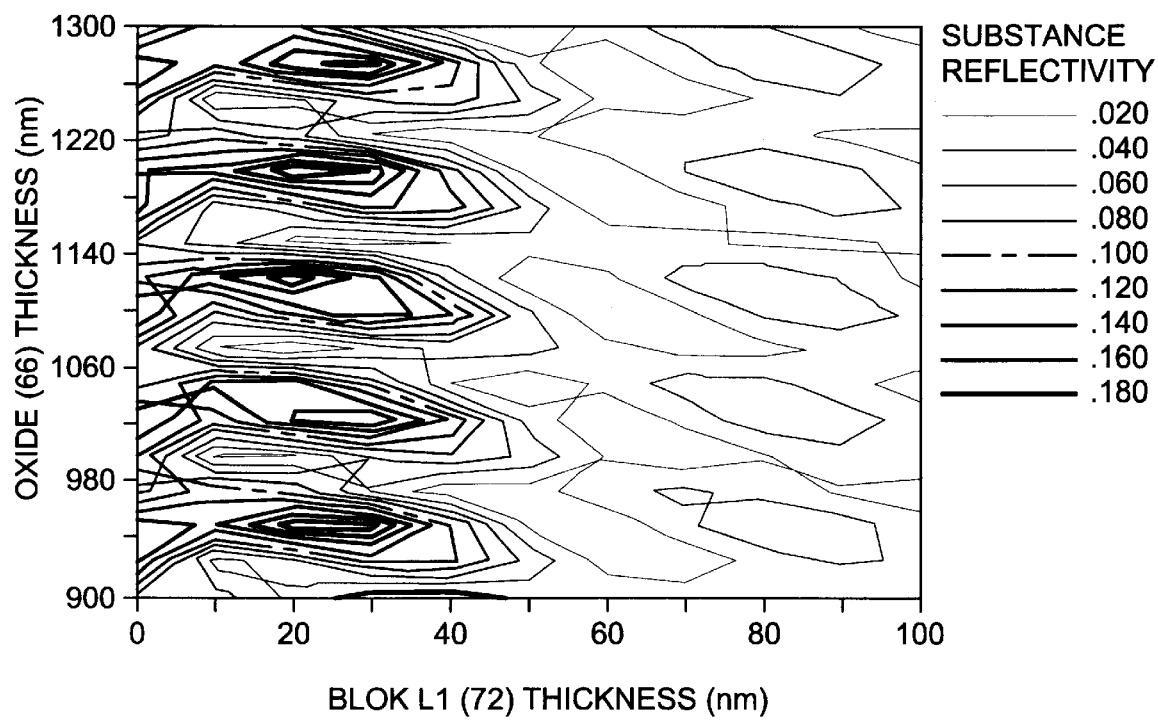
FIG. 19 is a reflectivity map of the embodiment of FIG. 18, showing the thickness of the ARC compared to the thickness of the dielectric layer under the ARC.

FIG. 18 is another embodiment similar to the embodiment of FIG. 16 with the addition of a SiC ARC 72 below the photoresist layer 74. The etch stop 68 of FIG. 9 is not used in the embodiment of FIG. 18 and the dielectric layer 66 is typically thicker than the separate dielectric layers of FIG. 9. The SiC barrier layer 64 is about 500 Å thick, although the thickness could vary. As shown in FIG. 19 below, the thickness of the dielectric layer 66 can vary without significantly affecting the reflectivity on the photoresist layer 74, when the SiC ARC 72 thickness is appropriately selected. However, a typical thickness of the dielectric layer 66 may be about 10,000 Å to about 12,000 Å.

FIG. 19 is a reflectivity map of the embodiment of FIG. 18, showing the thickness of the ARC compared to the thickness of the dielectric layer under the ARC for a projected reflectivity. In FIG. 19, the ARC 72 thickness is represented on the x-axis and the dielectric layer 66 thickness is represented on the y-axis. The reflectivity map shows that with an ARC thickness of about 520 Å or greater, any of the graphed thickness of the dielectric layer 66 may result in a reflectivity of about 5% or less. A preferred thickness of the SiC ARC is about 600 Å. The pattern repeats, as in other reflectivity maps, and thus other thicknesses of the oxide and/or SiC layer could be determined by extrapolation. Similar to the other embodiments discussed herein, the inventors have discovered that, with the unique properties of the SiC of the present invention, an ARC can be deposited that is substantially independent of the adjoining layer thickness, for a particular projected reflectivity. Here, using the SiC of the present invention, the ARC layer may be a deposition thickness of about 600 Å, regardless of the underlying layer thickness to obtain a projected reflectivity of about 5% or less. The graph may be analyzed for other appropriate ranges, as the particular application may find useful.

Figure 20:
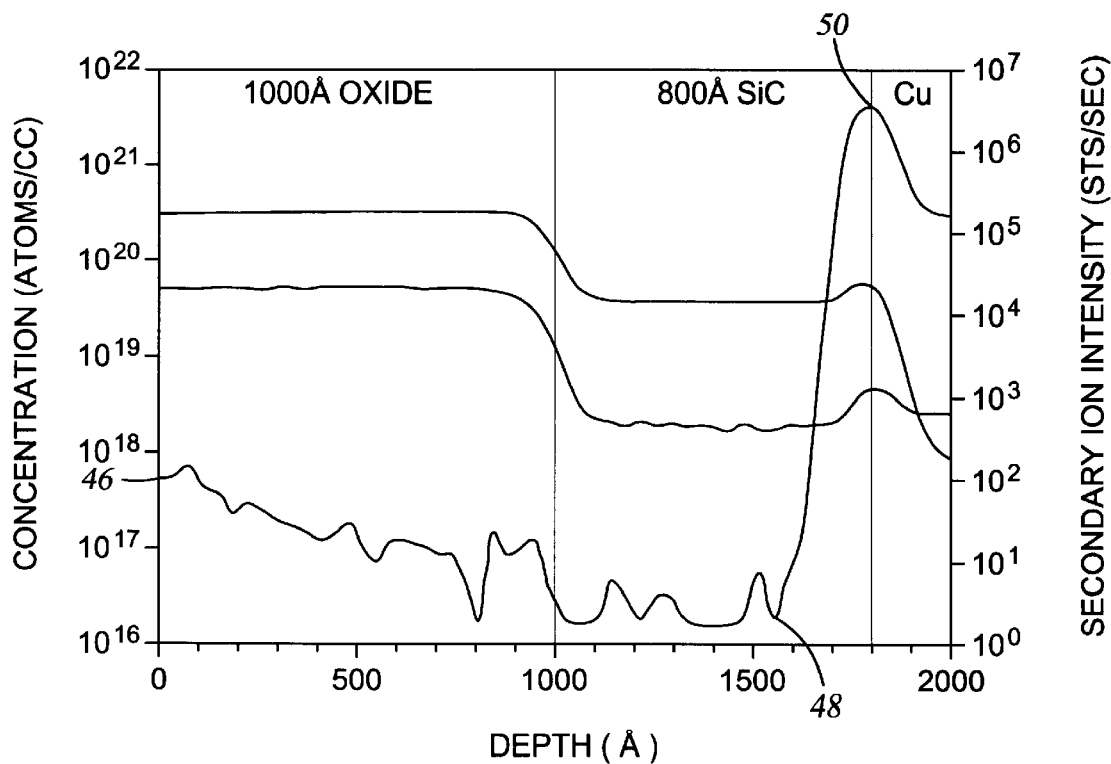
FIG. 20 is a graph of copper diffusion into the SiC material of the present invention.

Because the SiC of the present invention may be used in proximity to conductive materials, such a copper, that are prone to diffusion through adjacent layers, it is preferable that the SiC be diffusion resistant, as well. FIG. 20 shows the test specimen diffusion results, where the lower curve shows the copper content, showing the diffusion resistance to copper of the SiC ARC material of the present invention. The test specimen was a substrate with a 200 Å layer of copper, a 800 Å layer of SiC deposited on the copper, and a 1000 Å layer of oxide deposited on the SiC. Starting with the y-axis, FIG. 20 shows a value 46 of approximately $3 \times 10^{17}$ atoms per cubic centimeter (atoms/cc) at a depth of 0 Å from the surface of the 1000 Å oxide layer. This value reduces to value 48 of about $1 \times 10^{16}$ atoms/cc through the oxide layer and into the 800 Å SiC layer at a combined depth of about 1570 Å, before the copper diffusion becomes noticeable. The copper diffusion level then rises logarithmically for the next 230 Å to a value 50 of approximately $3 \times 10^{21}$ atoms/cc at the copper to copper barrier interface. Thus, the level of copper reduces by approximately four orders of magnitude, i.e., 1/10,000, within about 200 Å to 250 Å of the interface. This decrease in copper diffusion shows the effectiveness of the SiC material of the present invention.

The present invention further provides a substrate processing system having a plasma reactor including a chamber, a reaction zone in the chamber, a substrate holder for positioning a substrate in the reaction zone, and a vacuum system. The processing system further comprises a gas/liquid distribution system connecting the reaction zone of the vacuum chamber that supplies an silane-based compound, an inert gas, and an RF generator coupled to the gas distribution system for generating a plasma in the reaction zone. The processing system further includes a controller comprising a computer for controlling the plasma reactor, the gas distribution system, the RF generator, and a memory coupled to the controller, the memory comprising a computer usable medium including a computer readable program code for selecting the process steps for depositing a low dielectric constant film with a plasma of an silane-based compound.

The processing system may further comprise in one embodiment computer readable program code for selecting the process steps for depositing a barrier layer and/or etch stop of the silane-based compound, depositing a different dielectric layer, and optionally depositing a capping passivation layer of the silane-based compound.

While foregoing is directed to the preferred embodiment of the present invention, other and further embodiments of the invention may be devised without departing from the basis scope thereof, and the scope thereof is determined by the claims that follow. Furthermore, in this specification, including particularly the claims, the use of "comprising" with "a" or "the", and variations thereof means that the item(s) or list(s) referenced includes at least the enumerated item(s) or list(s) and furthermore may include a plurality of the enumerated item(s) or list(s), unless otherwise stated. Also, any disclosure of methods, including the claims, are presented in a logical order, but are not restricted to the sequence disclosed unless specifically stated.

What is claimed is:

1. A method of processing a substrate, comprising:
    depositing a silicon carbide barrier layer adjacent the substrate, wherein the silicon carbide barrier layer is deposited by:
        introducing silicon, carbon, and a noble gas into a chamber;
        initiating a plasma in the chamber; and
        reacting the silicon and the carbon in the presence of the plasma to deposit silicon carbide material, wherein the silicon carbide barrier layer has a low dielectric constant and is anti-reflective at ultraviolet wavelengths;
    depositing a dielectric layer adjacent the silicon carbide barrier layer;
    depositing an etch stop adjacent the dielectric layer, wherein the etch stop comprises silicon carbide deposited by:
        introducing silicon, carbon, and a noble gas into a chamber;
        initiating a plasma in the chamber; and
        reacting the silicon and the carbon in the presence of the plasma to deposit silicon carbide material; and
    depositing a photoresist layer adjacent the etch stop.

2. The method of claim 1, wherein the silicon and carbon are provided by introducing trimethylsilane into the chamber.

3. The method of claim 1, wherein the silicon carbide barrier layer has a reflectivity of about 7 percent or less.

4. The method of claim 3, wherein the dielectric layer has a thickness from about 5000 Å to about 10000 Å.

5. The method of claim 1, wherein the low dielectric constant is less than about 7.0.

6. The method of claim 1, wherein the silicon carbide barrier layer inhibits copper diffusion from a copper interface by about 3 orders of magnitude within about 300 Å or less from an interface.

7. A method of processing a substrate, comprising:
    depositing a silicon carbide barrier layer adjacent the substrate, wherein the silicon carbide barrier layer is deposited by:
        introducing trimethylsilane and a noble gas into a chamber; and
        reacting the trimethylsilane in the presence of a plasma;
    depositing a first dielectric layer on the silicon carbide barrier layer;
        depositing an etch stop on the first dielectric layer, wherein the etch stop comprises silicon carbide deposited by:
            introducing trimethylsilane and a noble gas into a chamber; and
            reacting the trimethylsilane in the presence of a plasma;
    depositing a second dielectric layer on the etch stop;
    depositing an anti-reflective coating on the second dielectric layer; and
    depositing a photoresist layer on the anti-reflective coating.

8. The method of claim 7, wherein the anti-reflective coating comprises silicon carbide deposited by:
    introducing trimethylsilane and a noble gas into a chamber; and
    reacting the trimethylsilane in the presence of the plasma to deposit silicon carbide material, wherein the silicon carbide material is anti-reflective at ultraviolet wavelengths.

9. The method of claim 8, wherein the anti-reflective coating has an absorption index, a refraction index, and a coating thickness and wherein the combination of the indexes and thickness provide an anti-reflective coating for the substrate having a reflectivity of about 7 percent or less that is substantially independent of a layer thickness of a dielectric layer adjacent the anti-reflective coating.

10. The method of claim 8, wherein the anti-reflective coating has a reflectivity of about 7 percent or less.

11. The method of claim 7, further comprising adjusting thicknesses of the first dielectric layer and the etch stop between the first and second dielectric layer for a projected reflectivity.

12. The method of claim 7, further comprising adjusting thicknesses of the second dielectric layer and the silicon carbide anti-reflective coating for a projected reflectivity.

13. The method of claim 7, wherein the silicon carbide barrier layer, the etch stop and the anti-reflective coating each have a dielectric constant of less than about 7.

14. A method of processing a substrate, comprising:
- depositing a silicon carbide barrier layer comprising an anti-reflective coating, the silicon carbide barrier layer being adjacent the substrate, wherein the silicon carbide barrier layer is deposited by:
  - introducing silicon, carbon, and a noble gas into a chamber;
  - initiating a plasma in the chamber; and
  - reacting the silicon and the carbon in the presence of the plasma to deposit silicon carbide material, wherein the silicon carbide barrier layer has a low dielectric constant and is anti-reflective at ultraviolet wavelengths;
- depositing a dielectric layer adjacent the silicon carbide barrier layer;
- depositing an etch stop adjacent the dielectric layer, wherein the etch stop comprises silicon carbide deposited by:
  - introducing silicon, carbon, and a noble gas into a chamber;
  - initiating a plasma in the chamber; and
  - reacting the silicon and the carbon in the presence of the plasma to deposit silicon carbide material;
- depositing a second dielectric layer on the etch stop; and
- depositing a photoresist layer adjacent the second dielectric layer.

15. The method of claim 14, wherein the silicon and carbon are provided by introducing trimethylsilane into the chamber.

16. The method of claim 14, wherein the anti-reflective coating has a reflectivity of about 7 percent or less.

17. The method of claim 16, wherein the first and second dielectric layers have a thickness from about 5000 Å to about 10000 Å.

18. The method of claim 14, wherein the low dielectric constant is less than about 7.0.

19. The method of claim 14, wherein the silicon carbide barrier layer inhibits copper diffusion from a copper interface by about 3 orders of magnitude within about 300 Å or less from an interface.

* * * * *